US006163614A

United States Patent [19]

Chen

[11] Patent Number: 6,163,614

[45] Date of Patent: Dec. 19, 2000

[54] PITCH SHIFT APPARATUS AND METHOD

[75] Inventor: Wen-Yuan Chen, Hsinchu, Taiwan

[73] Assignee: Winbond Electronics Corp., Hsinchu, Taiwan

[21] Appl. No.: 08/972,587

[22] Filed: Nov. 18, 1997

[30] Foreign Application Priority Data

Oct. 8, 1997 [TW] Taiwan ................................ 86114791

[51] Int. Cl.[7] ........................................................ H03G 5/00

[52] U.S. Cl. ............................................... 381/101; 381/98

[58] Field of Search ................................ 381/61, 98, 101; 333/28 T; 81/622, 602, 600, 659, 692

[56] References Cited

PUBLICATIONS

"On Audio Processing for MPEG Decoding, Pitch–shifting and Subband Coding". A thesis submitted to Institute of Electronics College of Engineering and Computer Science National Chiao Tung University in Partial Fulfillment of Requirements for the Degree of Master of Science in Electronics Engineering—Jun. 1996.

*Primary Examiner*—Minsun Oh Harvey
*Attorney, Agent, or Firm*—Ladas & Parry

[57] ABSTRACT

A pitch shift apparatus is provided to pitch shift a digital audio signal into a pitch-shifted signal. The apparatus comprises a receiving means, a pitch shifting means and a connecting means, wherein the connecting means comprises: a search region comparator for comparing each sample in the search region with a reference level to obtain a search region bit sequence representing the amplitude of each sample in the search region; a cross region comparator for comparing each sample in the cross region with the reference level to obtain a cross region bit sequence representing the amplitude of each sample in the cross region; a bit processor for bit comparing the cross region bit sequence and any sub-search region bit sequence of M samples in the search region to obtain a corresponding non-similarity; and a connecting device connecting the cross region and a sub-search region corresponding to the minimum non-similarity to renew the pitch-shifted signal.

10 Claims, 4 Drawing Sheets

PITCH SHIFT APPARATUS AND METHOD

FIELD OF THE INVENTION

The present invention relates in general to a pitch shift apparatus and method, and in particular, to a pitch shift apparatus and non-uniformed audio frame segmentation method, for fast searching and connecting two adjacent pitch-shifted audio frames to obtain a pitch-shifted signal.

BACKGROUND OF THE INVENTION

Pitch shifting a digital audio signal often involves increasing (compression pitch period) or decreasing (expansion pitch period) the output frequency. This is the same as increasing or decreasing the rotary speed of a platter. However, doing the latter also changes the time period of the digital audio signal, therefore, how to pitch shift a digital audio signal while keeping a constant time period has become an important issue.

To resolve this problem, an non-uniformed audio frame segmentation method has been proposed in the thesis "On Audio Processing for MPEG Decoding, Pitch-shifting and Subband Coding" submitted to the Institute of Electronics, College of Engineering and Computer Science, at National Chiao Tung University in partial fulfillment of requirements for the degree of Master of Science in Electronics Engineering in June, 1996. The operations are described as follows.

Step 1: first, select an audio frame of a time period N from the original digital audio signal;

Step 2: then, pitch shift the audio frame to obtain a pitch-shifted audio frame of a time period mN (compression pitch period when m<1; and expansion pitch period when m>1);

Step 3: next, select another audio frame of a time period N from the digital audio signal at time mN corresponding to the end of the previous audio frame;

Step 4: repeat step 2 to pitch shift the audio frame in step 3;

Step 5: finding out a optimum connecting point of these two audio frames to obtain a pitch-shifted audio signal of a time period 2mN−X (X is the deviation caused by the connecting operation);

Step 6: next, select a further audio frame of the original digital audio signal at time 2mN−X; and Step 7: repeat step 4 through step 6 to renew the pitch-shifted signal.

For this non-uniformed audio frame segmentation method, the optimum connecting point is searched by evaluating and comparing the mean absolute error (MAE) of the rear samples of the first audio frame (which is called the search region later) and the front samples of the second audio frame (which is called the cross region later). And, the mean absolute error (MAE) is calculated by:

$$MAE(i) = \sum_{j=0}^{M-1} |C(j) - S(i+j)| \qquad i = 0 \sim N - M$$

where C is the cross region having M samples; and S is the search region having N(>M) samples.

Then, the optimum connecting point is the sample corresponding to a minimum mean absolute error (MAE). These two audio frames are connected by:

$$P(i+j) = \frac{j}{M} * C(j) + \frac{M-j}{M} * S(i+j) \qquad j = 0 \sim M - 1$$

where i is the position of the optimum connecting point, P is the connecting region which is followed by another audio frame.

FIG. 1 (Prior Art) is a diagram showing a digital audio signal in an non-uniformed audio frame segmentation method when being expansion pitch shifted.

Suppose the original digital audio signal S0 consists of a plurality of contiguous samples. At first, select and expansion pitch period an audio frame D1 of a time period L1 from the digital audio signal S0, such as 0 through L1−1 shown in FIG. 1, to obtain a pitch-shifted audio frame D1' of a time period L2.

Then, select and expansion pitch period another audio frame D2 of a time period L1 from the original digital audio signal S0 at time L2 (the time L2 corresponds to the end of the pitch-shifted audio frame D1'), such as L2 through L1+L2−1 shown in FIG. 1, to obtain another pitch-shifted audio frame D2' of a time period L2.

Next, connect the audio frames D1' and D2'.

At first, select a search region Sa from the rear samples of the pitch-shifted audio frame D1' and the original digital audio signal S0 just following the pitch-shifted audio frame D1', and select a cross region Ca from the front samples of the pitch-shifted audio frame D2'. Then, evaluate and compare each sample in the search region Sa and cross region Ca as mentioned above to obtain an optimum connecting point K1 and subsequently connect these two pitch-shifted audio frames D1', D2' to obtain an expansion pitch-shifted signal S0' until the end.

FIG. 2 (Prior Art) is a diagram showing a digital audio signal in the non-umiformed audio frame segmentation method when being compression pitch period.

Suppose the original digital audio signal S1 consists of a plurality of contiguous samples. At first, select and compression pitch period a audio frame D3 of a time period L3 from the digital audio signal S1, such as 0 through L3−1 shown in FIG. 2, to obtain a pitch-shifted audio frame D3' of a time period L4.

Then, select and compression pitch period another audio frame D4 of a time period L3 from the original digital audio signal S1 at time L4 (the time L4 corresponds to the end of the pitch-shifted audio frame D3'), such as L4 through L3+L4−1 shown in FIG. 2, to obtain another pitch-shifted audio frame D4' of a time period L4.

Next, connect the audio frames D3' and D4'.

At first, select a search region Sb from the rear samples of the pitch-shifted audio frame D3' and the original digital audio signal S1 just following the pitch-shifted audio frame D3', and select a cross region Cb from the front samples of the pitch-shifted audio frame D4'. Next, evaluate and compare each sample in the search region Sb and cross region Cb as mentioned above to obtain an optimum connecting point K2 and subsequently connect these two pitch-shifted audio frames D3', D4' to obtain a compression pitch-shifted signal S1' until the end.

However, in using this non-uniformed audio frame segmentation method, when N=160 and M=80, it is necessary to perform (80+79)*80=12720 add/subtract operations every 10 ms, which incurs a large cost in hardware implementation. Therefore, it is necessary and useful to provide an easy and effective apparatus and method to find out the optimum connecting point so that the pitch shift apparatus can be economically designed and applied in commercial electronics products.

SUMMARY OF THE INVENTION

Therefore, an object of the present invention is to provide a pitch shift apparatus and method, which can use simple logic to find out the connecting point, and greatly reduce the cost of hardware implementation.

The present invention provides a pitch shift method for pitch shifting a digital audio signal to a pitch-shifted signal. In this method, an audio frame having R samples from the digital audio signal is first selected and pitch shifted to obtain a pitch-shifted audio frame as the pitch-shifted signal having a time period L'. Another audio frame also having R samples is then selected and pitch shifted from the digital audio signal beginning at time L' to obtain another pitch-shifted audio frame. Next, the latter pitch-shifted audio frame is connected to the pitch-shifted signal to renew the pitch-shifted signal. And the above two steps are repeated to obtain the output pitch-shifted signal.

Furthermore, in the connecting step, a search region having N samples from the rear part of the pitch-shifted signal and the digital audio signal adjacent to the rear of the pitch-shifted signal is first selected, and each sample in the search region is compared with a reference level to obtain a search region bit sequence representing the amplitude of each sample in the search region. Then, a cross region having M samples from the front part of the latter pitch-shifted audio frame is selected, and each sample in the cross region is compared with the reference level to obtain a cross region bit sequence representing the amplitude of each sample in the cross region. Next, the cross region bit sequence and any sub-search region bit sequence having M samples in the search region are bit compared to obtain a non-similarity corresponding to the cross region bit sequence and the sub-search region bit sequence. And the pitch-shifted signal is renewed by connecting the cross region and a sub-search region having the minimum non-similarity.

In addition, the cross region bit sequence and any sub-search region bit sequence having M samples in the search region bit sequence are compared by an XOR logic. And, the non-similarity is obtained by counting the 1's in the output of the XOR logic.

Further, the present invention also provides a pitch shift apparatus for pitch shifting a digital audio signal to a pitch-shifted signal This apparatus includes a receiving means, a pitch-shifting means and a connecting means. The receiving means is provided for receiving the digital audio signal. The pitch-shifting means is provided for selecting and pitch shifting a predetermined number of samples in the digital audio signal to obtain a pitch-shifted audio frame. And the connecting means is provided for connecting the pitch-shifted audio frame to the pitch-shifted signal to renew the pitch-shifted signal.

In addition, the connecting means also includes a search region comparator, a cross region comparator, a bit processor and a connecting device. The search region comparator is provided for comparing each sample in the search region with a reference level to obtain a search region bit sequence representing the amplitude of each sample in the search region. The cross region comparator is provided for comparing each sample in the cross region with the reference level to obtain a cross region bit sequence representing the amplitude of each sample in the cross region. The bit processor is provided for bit comparing the cross region bit sequence and any sub-search region bit sequence having M samples in the search region to obtain a non-similarity corresponding to the cross region bit sequence and the sub-search region bit sequence. And the connecting device is provided for connecting the cross region and a sub-search region having the minimum non-similarity to renew the pitch-shifted signal.

BRIEF DESCRIPTION OF THE DRAWINGS

The following detailed description, given by way of example and not intended to limit the invention solely to the embodiments described herein, will best be understood in conjunction with the accompanying drawings, in which.

DESCRIPTION OF THE PREFERRED EMBODIMENT

From the above, since the previous pitch shift apparatus and method calculate mean absolute error (MAE) for finding out the optimum connecting point, the cost of hardware implementations is great.

In digital audio signal processing, the time period of an audio frame is usually short (somewhere between 20 ms and 30 ms), and the samples in audio frames are found to be statistically stationary. Therefore, adjacent audio frames are often similar in both amplitude and shape. The present invention provides a pitch shift apparatus and method according to this property so that the optimum connecting point can be obtained by only comparing the amplitudes' shapes of adjacent audio frames, thereby reducing the cost of hardware implementation.

Figure 5:
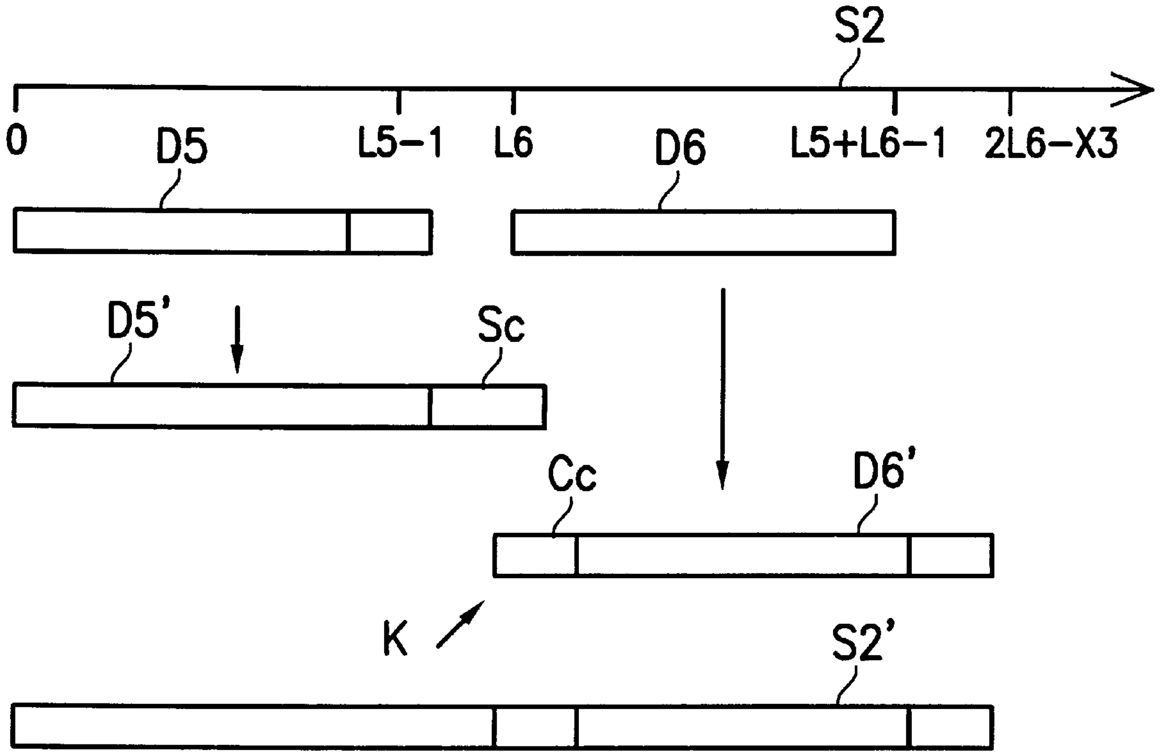
FIG. 5 is a diagram showing a digital audio signal when being expansion pitch period using the non-uniformed audio frame segmentation method according to pitch shift method of the present invention.

FIG. 5 is a diagram showing a digital audio signal in non-uniformed audio frame segmentation method when expansion pitch period according to pitch shift method of the present invention.

Figure 1:
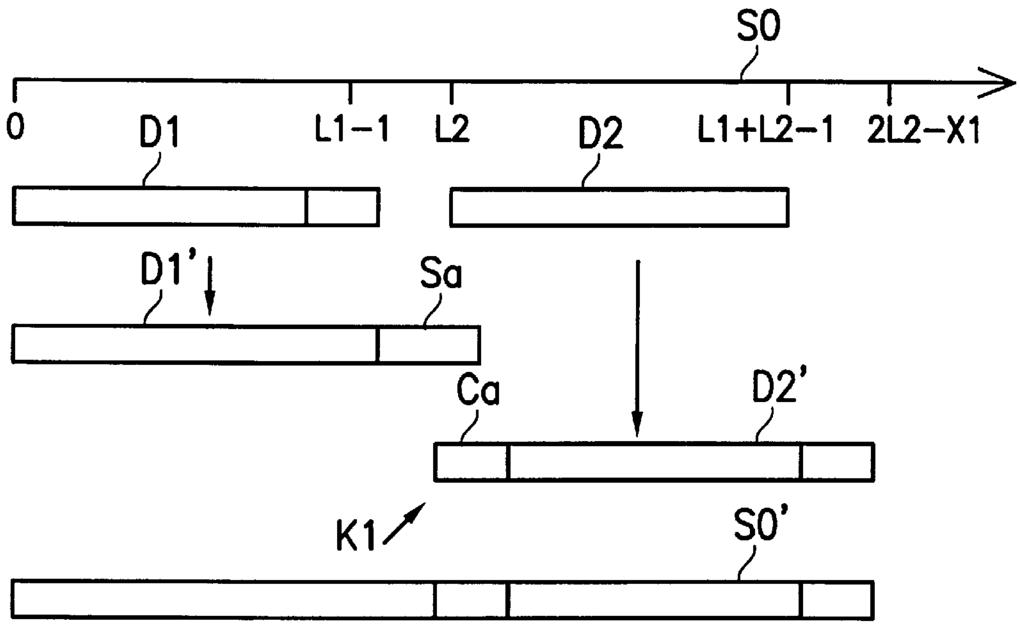
FIG. 1 (PRIOR ART)
FIG. 1 (Prior Art) is a diagram showing a digital audio signal when undergoing expansion pitch period by the non-uniformed audio frame segmentation method.
Figure 2:
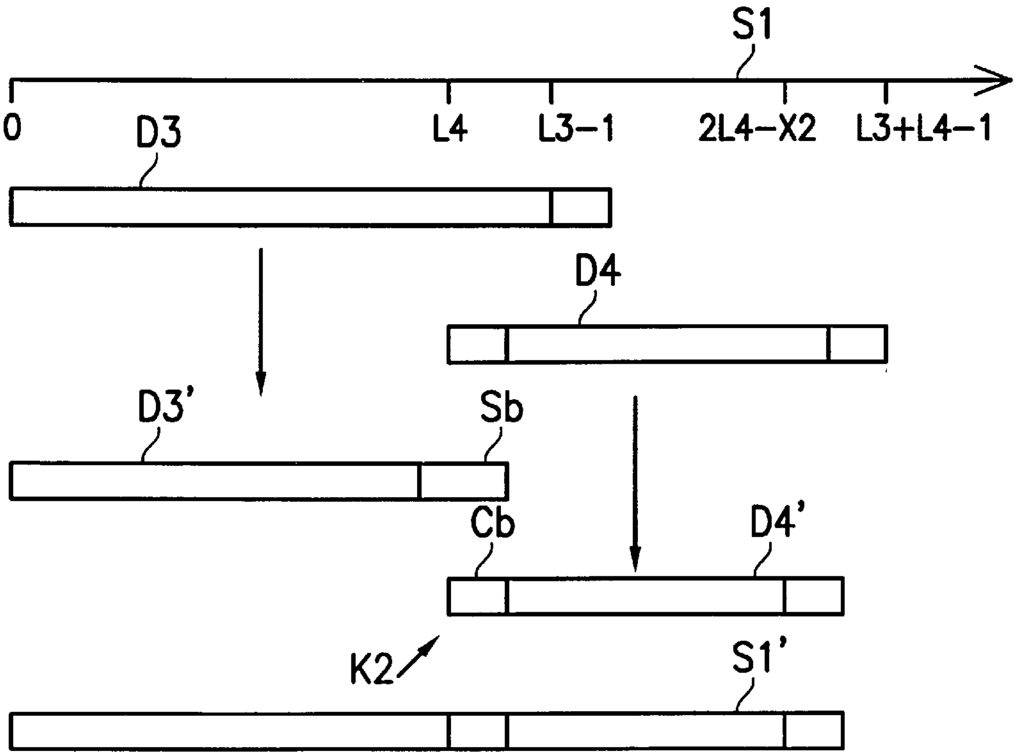
FIG. 2 (PRIOR ART)
FIG. 2 (Prior Art) is a diagram showing a digital audio signal when undergoing compression pitch period by the non-uniformed audio frame segmentation method.

In this embodiment, suppose the original digital audio signal S2 consists of a plurality of contiguous samples as shown in FIG. 1 and FIG. 2. At first, select and expansion pitch period a audio frame D5 of a time period L5 from the original digital audio signal S2, such as 0 through L5−1 shown in FIG. 5, to obtain a expansion pitch-shifted audio frame D5' of a time period L6 as the expansion pitch-shifted signal S2'.

Then, select and expansion pitch period another audio frame D6 of a time period L5 from the digital audio signal S2 at time L6 (the time L6 corresponds to the end of the pitch-shifted audio frame D5'), such as L6 through L5+L6−1 shown in FIG. 3, to obtain a expansion pitch-shifted audio frame D6' of a time period L6.

Next, connect the pitch-shifted audio frames D5' and D6'.

Unlike the previous shift apparatus and method, the present invention utilizes bit comparators to simplify the hardware implementation and the cost.

Figure 3A:
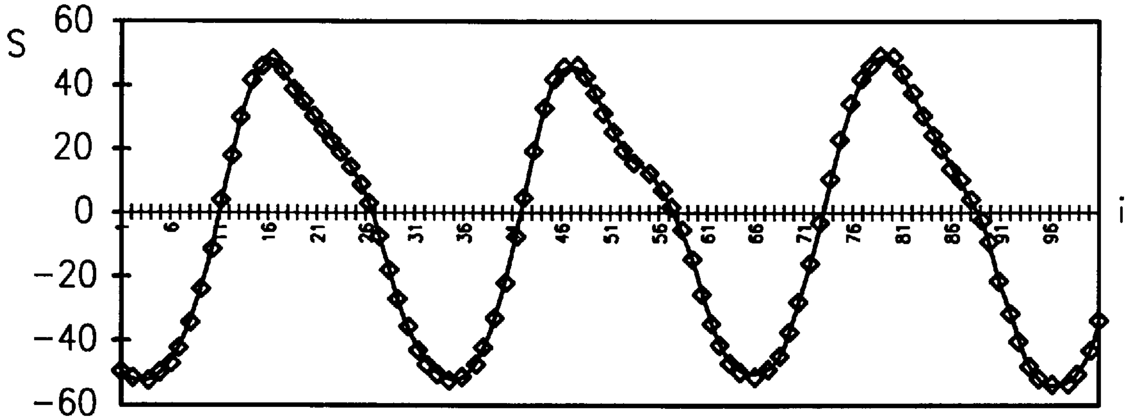
FIG. 3A is a diagram showing samples in the search region of the pitch shift apparatus according to the present invention.
Figure 3B:
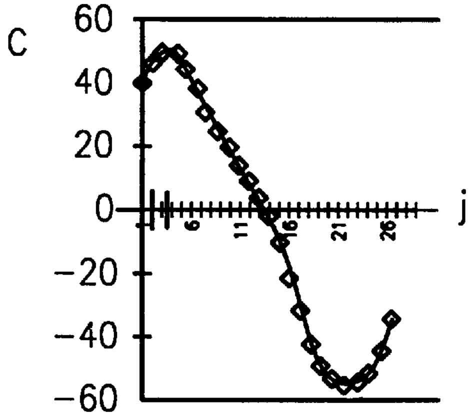
FIG. 3B is a diagram showing samples in the cross region of the pitch shift apparatus according to the present invention.

FIG. 3A and FIG. 3B are diagrams showing samples in the search region and cross region of the pitch shift apparatus according to the present invention, wherein the search region Sc having N samples can be selected from the rear samples of the temporary pitch-shifted signal S2' (the pitch-shifted audio frame D5' obtained previously) and the digital audio signal S2 just following the pitch-shifted audio frame D5'. The cross region Cc having M samples can be selected from the front samples of the pitch-shifted audio frame D6'.

In this case, the search region Sc is designed to have some samples in the original digital audio signal S2 so that the optimum connecting point can be determined without seriously affecting the time period of the pitch-shifted signal S2'.

Figure 4:
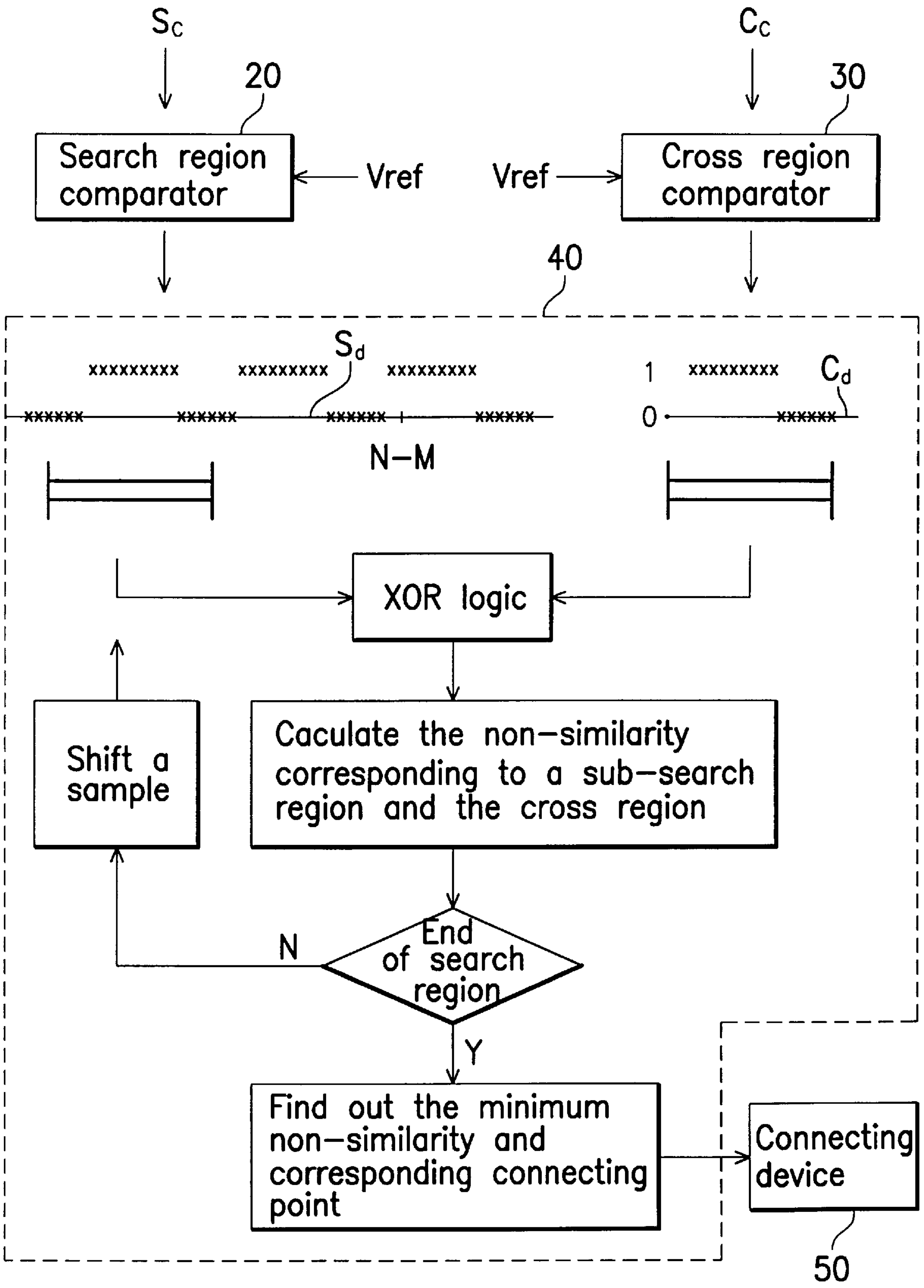
FIG. 4 is a block diagram showing the pitch shift apparatus according to the present invention utilizing the non-uniformed audio frame segmentation method.

FIG. 4 is a block diagram showing the pitch shift apparatus according to the present invention using non-uniformed audio frame segmentation method.

In this embodiment, to reduce the cost of hardware implementation, the samples in the search region Sc and cross region Cc are first compared with a reference level Vref respectively by a cross region comparator 20 and a search region comparator 30 (the output of the comparators 20, 30 is logical 1 when the sample is higher than the reference level Vref and logical 0 when the sample is lower than the reference level Vref) to obtain a search region bit sequence Sd and a cross region bit sequence Cd representing the amplitude of each sample in the search region Sc and cross region Cc.

Then, a bit processor 40 is provided for bit comparing each sample in the crosss region bit sequence Cd of M samples and all sub-search regions bit sequence of M samples selected from the search region Sc to obtain a corresponding non-similarity. In this embodiment, the cross region bit sequence Cd and all sub-search region bit sequence of M samples selected from the search region Sc can be compared by an XOR logic. Furthermore, the non-similarity can be obtained by counting logical 1's of the output of the XOR logic.

Next, connecting the cross region Cc and a sub-search region Ssub corresponding to the minimum non-similarity are connected at a corresponding connecting point K so that the connected pitch-shifted frames are regarded as the renewed pitch-shifted signal S2'.

In this case, since the time period of a audio frame ranges approximately between 20 ms and 30 ms, and the non-similarity can be obtained only by simple logic, the cost of the pitch shift apparatus can be greatly reduced.

Further, the present invention also provides a pitch shift apparatus for pitch shifting a digital audio signal to a pitch-shifted signal. This apparatus comprises a receiving means, a pitch-shifting means and a connecting means, wherein the receiving means is provided for receiving the digital audio signal. The pitch-shifting means is provided for selecting and pitch shifting a predetermined number of samples in the digital audio signal to obtain a pitch-shifted audio frame. The connecting means is provided for connecting the pitch-shifted audio frame to the pitch-shifted signal to renew the pitch-shifted signal.

In addition, the connecting means further comprises a search region comparator 20, a cross region comparator 30, a bit processor 40 and a connecting device 50.

The search region comparator 20 is provided for comparing each sample in the search region Sc with a reference level, like 0V, to obtain a search region bit sequence Sd representing the amplitude of each sample in the search region Sc. The search region can have N samples selected from the rear samples of the pitch-shifted audio frame D5' and the digital audio signal S2 just following the pitch-shifted audio frame D5'.

The cross region comparator 30 is provided for comparing each sample in the cross region Cc with the reference level, like 0V, to obtain a cross region bit sequence Cd representing the amplitude of each sample in the cross region Cc. The cross region can have M samples selected from the front samples of the pitch-shifted audio frame D6'.

The bit processor 40 is provided for bit comparing the cross region bit sequence Cd having M samples and any sub-search region bit sequences Sd of M samples selected from the search region Sc (for example, by an XOR logic) to obtain a non-similarity corresponding to the cross region bit sequence Cd and the sub-search region bit sequence Sd. The non-similarity can be obtained by counting the logical 1's of the output of the XOR logic.

The connecting device 50 is provided for connecting the cross region Cc and a sub-search region Ssub corresponding to the minimum non-similarity to renew the pitch-shifted signal S2'. For example, all the non-similarity corresponding to the cross region Cc and all the sub-search region Ssub in the search region Sc are compared to obtain a minimum non-similarity and a corresponding connecting point K. Then, the cross region Cc and the sub-search region corresponding to the minimum non-similarity are connected to renew the pitch-shifted signal S2'.

To sum up, the pitch shift apparatus and method of the present invention can utilize simple logic to accomplish the pitch shifting of a digital audio signal and reduce the cost of the hardware implementation, therefore can be economically applied in commercial electronics products.

The foregoing description of a preferred embodiment of the present invention has been provided for the purposes of illustration and description only. It is not intended to be exhaustive or to limit the invention to the precise forms disclosed. Many modifications and variations will be apparent to practitioners skilled in this art. The embodiment was chosen and described to best explain the principles of the present invention and its practical application, thereby enabling those who are skilled in the art to understand the invention for various embodiments and with various modifications as are suited to the particular use contemplated. It is intended that the scope of the invention be defined by the following claims and their equivalents.

What is claimed is:

1. A pitch shift method for pitch shifting a digital audio signal, comprising the steps of:

(a) selecting and pitch shifting a first audio frame of R samples from the digital audio signal to obtain a first pitch-shifted audio frame as a pitch-shifted signal with a time period L';

(b) pitch shifting a second audio frame of R samples selected from the digital audio signal at time L' to obtain a second pitch-shifted audio frame;

(c) connecting the second pitch-shifted audio frame to the pitch-shifted signal to renew the pitch-shifted signal; and (d) repeating step (b) and (c) to obtain the output pitch-shifted signal;

wherein, the step (c) comprises:

selecting a search region of N samples from the rear of the pitch-shifted signal and the digital audio signal adjacent to the rear of the pitch-shifted signal;

comparing each sample in the search region with a reference level to obtain a search region bit sequence representing the amplitude of each sample in the search region;

selecting a cross region of M samples from the front of the second pitch-shifted audio frame;

comparing each sample in the cross region with the reference level to obtain a cross region bit sequence representing the amplitude of each sample in the cross region;

bit comparing the cross region bit sequence and any sub-search region bit sequence of M samples in the search region to obtain a non-similarity corresponding to the cross region bit sequence and the sub-search region bit sequence; and connecting the cross region and a sub-search region corresponding to the minimum non-similarity to renew the pitch-shifted signal.

2. The pitch shift method as claimed in claim 1, wherein the non-similarity corresponding to the cross region bit sequence and the sub-search region bit sequence is formed by:

bit comparing the cross region bit sequence and any sub-search region bit sequence of M samples in the search region bit sequence to obtain a non-similarity bit sequence; and counting the number of first-level bits in the non-similarity bit sequence as the non-similarity.

3. The pitch shift method as claimed in claim 1, wherein the search region of N samples is larger than the cross region of M samples.

4. The pitch shift method as claimed in claim 3, wherein the search region of N samples is selected from the last N samples in the pitch-shifted signal.

5. The pitch shift method as claimed in claim 1, wherein the cross region bit sequence and any sub-search region bit sequence of M samples in the search region bit sequence are compared by an XOR logic.

6. The pitch shift method as claimed in claim 5, wherein the non-similarity is obtained by counting the logical 1's in the output of the XOR logic.

7. A pitch shift apparatus for pitch shifting a digital audio signal to a pitch-shifted signal, comprising:

a receiving means for receiving the digital audio signal;

a pitch-shifting means for selecting and pitch shifting a predetermined number of samples in the digital audio signal to obtain a pitch-shifted audio frame; and a connecting means for connecting the pitch-shifted audio frame to the pitch-shifted signal to renew the pitch-shifted signal;

wherein the connecting means comprises:

a search region comparator for comparing each sample in the search region with a reference level to obtain a search region bit sequence representing the amplitude of each sample in the search region;

a cross region comparator for comparing each sample in the cross region with the reference level to obtain a cross region bit sequence representing the amplitude of each sample in the cross region;

a bit processor for bit comparing the cross region bit sequence and any sub-search region bit sequence of M samples in the search region to obtain a non-similarity corresponding to the cross region bit sequence and the sub-search region bit sequence; and a connecting device connecting the cross region and a sub-search region corresponding to the minimum non-similarity to renew the pitch-shifted signal.

8. The pitch shift apparatus as claimed in claim 7, wherein the reference level is 0V.

9. The pitch shift apparatus as claimed in claim 7, wherein the bit processor is an XOR logic.

10. The pitch shift apparatus as claimed in claim 7, wherein the non-similarity is obtained by counting the logical 1's in the output of the XOR logic.

* * * * *